United States Patent
Pu et al.

(10) Patent No.: US 9,537,385 B2
(45) Date of Patent: Jan. 3, 2017

(54) INDUCTION CURRENT SAMPLING DEVICE AND METHOD FOR BRIDGELESS PFC CIRCUIT

(71) Applicant: ZTE Corporation, Shenzhen, Guangdong (CN)

(72) Inventors: Xifeng Pu, Shenzhen (CN); Dacheng Zheng, Shenzhen (CN); Binchuan Dai, Shenzhen (CN); Dan Li, Shenzhen (CN); Zhenghai Wan, Shenzhen (CN); Junkai Li, Shenzhen (CN)

(73) Assignee: ZTE CORPORATION, Shenzhen, Guangdong (CN)

(*) Notice: Subject to any disclaimer, the term of this patent is extended or adjusted under 35 U.S.C. 154(b) by 0 days.

(21) Appl. No.: 14/441,995

(22) PCT Filed: Jun. 28, 2013

(86) PCT No.: PCT/CN2013/078450
§ 371 (c)(1),
(2) Date: May 11, 2015

(87) PCT Pub. No.: WO2013/167016
PCT Pub. Date: Nov. 14, 2013

(65) Prior Publication Data
US 2015/0280547 A1    Oct. 1, 2015

(30) Foreign Application Priority Data
Nov. 13, 2012 (CN) .......................... 2012 1 0453486

(51) Int. Cl.
*H02M 1/42* (2007.01)
*H02M 7/217* (2006.01)
(Continued)

(52) U.S. Cl.
CPC ............ *H02M 1/4208* (2013.01); *G01R 19/00* (2013.01); *G01R 19/0092* (2013.01); *H02M 1/42* (2013.01);
(Continued)

(58) Field of Classification Search
CPC .. H02M 1/4208; H02M 7/217; G01R 19/0092
See application file for complete search history.

(56) References Cited

U.S. PATENT DOCUMENTS 8,564,993 B2 * 10/2013 Lin ..................... H02M 1/4208
                                                                363/127
2006/0022648 A1    2/2006 Ben-Yaakov
(Continued)

FOREIGN PATENT DOCUMENTS

| CN | 101552546 A | 10/2009 |
| CN | 101958550 A | 1/2011 |

(Continued)

OTHER PUBLICATIONS

International Search Report in international application No. PCT/CN2013/078450, mailed on Oct. 17, 2013.
(Continued)

*Primary Examiner* — Jue Zhang
(74) *Attorney, Agent, or Firm* — Oppedahl Patent Law Firm LLC

(57) ABSTRACT

Disclosed are an induction current sampling device and method for a bridgeless PFC circuit. The device includes a first sampling unit, a second sampling circuit and a third sampling circuit, wherein the first sampling unit, connected in serial with a first switch transistor of the bridgeless PFC circuit, is configured to sample a current flowing through the first switch transistor to acquire a first sampling signal V1; the the second sampling unit, connected in serial with a second switch transistor of the bridgeless PFC circuit, is (Continued)

configured to sample a current flowing through the second switch transistor to acquire a second sampling signal V2; and the third sampling unit, with one terminal connected with a ground of the bridgeless PFC circuit and the other terminal connected with a negative output of a PFC capacitor of the bridgeless PFC circuit, is configured to sample a current flowing through a boost diode of the bridgeless PFC circuit to acquire a third sampling signal V3.

8 Claims, 5 Drawing Sheets

(51) Int. Cl.
*G01R 19/00* (2006.01)
*H02M 1/00* (2006.01)

(52) U.S. Cl.
CPC ......... *H02M 1/4225* (2013.01); *H02M 1/4233* (2013.01); *H02M 7/217* (2013.01); *H02M 2001/0009* (2013.01); *Y02B 70/126* (2013.01)

(56) References Cited

U.S. PATENT DOCUMENTS

| 2006/0198172 | A1* | 9/2006 | Wood | H02M 1/4233 363/89 |
| 2009/0206902 | A1 | 8/2009 | Li | |
| 2009/0230929 | A1* | 9/2009 | Sui | G05F 1/70 323/207 |
| 2009/0256543 | A1* | 10/2009 | Yang | H02M 1/4208 323/284 |
| 2011/0075462 | A1 | 3/2011 | Wildash | |
| 2012/0051107 | A1* | 3/2012 | Choi | H02M 1/4208 363/126 |
| 2012/0293141 | A1* | 11/2012 | Zhang | H02M 1/4233 323/207 |
| 2013/0077365 | A1* | 3/2013 | Chalermboon | H02M 1/4208 363/89 |

FOREIGN PATENT DOCUMENTS

| CN | 201813314 U | 4/2011 |
| CN | 102291018 A | 12/2011 |
| CN | 102721848 A | 10/2012 |

OTHER PUBLICATIONS

English Translation of the Written Opinion of the International Search Authority in international application No. PCT/CN2013/078450, mailed on Oct. 17, 2013.
Supplementary European Search Report in European application No. 13788227.0, mailed on Mar. 24, 2016.

* cited by examiner

Prior Art

INDUCTION CURRENT SAMPLING DEVICE AND METHOD FOR BRIDGELESS PFC CIRCUIT

TECHNICAL FIELD

The disclosure relates to electronics, and in particular to an induction current sampling device and method for a bridgeless Power Factor Correction (PFC) circuit.

BACKGROUND

With rapid development of modern industry, there is an ever-increasing demand for power supply systems, and environment-friendly and energy saving power supplies have already become an application trend. Therefore, power conversion topologies having high efficiency and high power density have become favored in the industry. Due to their features including high efficiency and high power density, bridgeless PFC circuits are gradually applied to power supply modules having high efficiency and high power density.

In a bridgeless PFC circuit, an induction current is desired to be sampled to perform loop control so as to ensure that an AC input current follows an AC input voltage, thereby implementing the functionality of power factor correction. Compared to a traditional PFC circuit, the bridgeless PFC circuit has a boost inductor directly coupled to an AC voltage input, which increases the difficulty for sampling the induction current.

For a bridgeless PFC circuit, an existing induction current sampling method is described as follows.

FIG. 1 is a schematic diagram of bi-resistor sampling mode in the prior art. As shown in FIG. 1, in switching branches of the bridgeless PFC circuit, there are two serially-connected sampling units Rs1, Rs2 for sampling currents flowing through respective bridgeless PFC switch transistors, i.e., rise edges of induction currents in the bridgeless PFC circuit. Using such a way to sample an induction current of the bridgeless PFC circuit has the following drawbacks: when an AC input voltage is very high, the bridgeless PFC boost circuit has a very small duty cycle, and due to the existence of problems such as sampling delay, the sampling circuit cannot sample the induction current, this then results in loss of control of the control loop and thus threatens reliability of the power supply.

FIG. 2 is a schematic diagram of a bi-current-transformer sampling mode in the prior art, as shown in FIG. 2, a first current transformer P1 is connected in serial between an inductor L12 and a switch transistor S12 of the bridgeless PFC circuit; and a second current transformer P2 is connected in serial between an inductor L22 and an anode of a diode D22 of the bridgeless PFC circuit. A current flowing through the bridgeless PFC switch transistor is characterized by calculation of the sum (I1+I2) of a current flowing through the first current transformer and a current flowing through the second current transformer, i.e., rise edges of induction currents in the bridgeless PFC circuit. Similarly, this sampling device has the following drawbacks: when an AC input voltage is very high, the bridgeless PFC boost circuit has a very small duty cycle, and due to the existence of problems such as sampling delay, the sampling circuit cannot sample the induction current, this then results in loss of control of the control loop and thus threatens reliability of the power supply.

SUMMARY

Embodiments of the disclosure provide an induction current sampling device and method for a bridgeless PFC circuit so as to solve the problem in the prior art that reliability of a power supply is reduced during induction current sampling due to the small duty cycle of the PFC circuit in the case when an AC input voltage is very high in the bridgeless PFC circuit.

An embodiment of the disclosure provides an induction current sampling device for a bridgeless PFC circuit, which includes a first sampling unit, a second sampling circuit and a third sampling circuit, wherein the first sampling unit, connected in serial with a first switch transistor of the bridgeless PFC circuit, is configured to sample a current flowing through the first switch transistor to acquire a first sampling signal V1; the second sampling unit, connected in serial with a second switch transistor of the bridgeless PFC circuit, is configured to sample a current flowing through the second switch transistor to acquire a second sampling signal V2; and the third sampling unit, with one terminal connected with a ground of the bridgeless PFC circuit and the other terminal connected with a negative output of a PFC capacitor of the bridgeless PFC circuit, is configured to sample a current flowing through a boost diode of the bridgeless PFC circuit to acquire a third sampling signal V3.

In an embodiment, the first sampling unit may be a first sampling resistor or a first current sensing device, the second sampling unit may be a second sampling resistor or a second current sensing device, and the third sampling unit may be a third sampling resistor or a third current sensing device.

In an embodiment, the first sampling unit is a first sampling resistor Rs1, the second sampling unit is a second sampling resistor Rs2, the third sampling unit is a third sampling resistor Rs3; a first terminal of a first inductor L1 of the bridgeless PFC circuit is connected with a first terminal of an AC power supply of the bridgeless PFC circuit, a second terminal of the first inductor L1 is connected with an anode of a first boost diode D1 of the bridgeless PFC circuit and connected to a first terminal of a first switch transistor S1 of the bridgeless PFC circuit; a second terminal of the first switch transistor S1 is connected with a first terminal of the first sampling resistor Rs1; a second terminal of the first sampling resistor Rs1 is connected with the ground of the bridgeless PFC circuit; a cathode of the first boost diode D1 is connected with a positive input of a PFC capacitor C1 of the bridgeless PFC circuit; a first terminal of a second inductor L2 of the bridgeless PFC circuit is connected with a second terminal of the AC power supply, a second terminal of the second inductor L2 is connected with an anode of a second boost diode D2 of the bridgeless PFC circuit and connected to a first terminal of a second switch transistor S2 of the bridgeless PFC circuit; a second terminal of the second switch transistor S2 is connected with a first terminal of the second sampling resistor Rs2; a second terminal of the second sampling resistor Rs2 is connected with the ground of the bridgeless PFC circuit; a cathode of the second boost diode D2 is connected with the positive input of the PFC capacitor C1 of the bridgeless PFC circuit; and a first terminal of the third sampling resistor Rs3 is connected with the ground of the bridgeless PFC circuit, a second terminal of the third sampling resistor Rs3 is connected with a negative output of the PFC capacitor C1 of the bridgeless PFC capacitor; a first terminal of a load is connected with a positive input of an electrolytic capacitor C1, a second terminal of the load is connected with a negative output of the electrolytic capacitor C1.

In an embodiment, the first sampling unit is the first current sensing device, the second sampling unit is the second current sensing device, and the third sampling unit is the third current sensing device; the first current sensing device includes a first current transformer CT1, a fifth resistor R5, a fifth diode D5 and a fourth sampling resistor Rs4, a first terminal on a secondary side of the first current transformer CT1 being connected with a first terminal of the fifth resistor R5, an anode of the fifth diode D5 being connected with the first terminal of the fifth resistor R5, a cathode of the fifth diode D5 being connected with a first terminal of the fourth sampling resistor Rs4, a second terminal of the fifth resistor R5 being connected with a second terminal of the fourth sampling resistor Rs4; the second current sensing device includes a second current transformer CT2, a sixth resistor R6, a sixth diode D6 and a fifth sampling resistor Rs5, a first terminal on a secondary side of the second current transformer CT2 being connected with a first terminal of the sixth resistor R6, an anode of the sixth diode D6 being connected with the first terminal of the sixth resistor R6, a cathode of the sixth diode D6 being connected with a first terminal of the fifth sampling resistor Rs5, a second terminal of the sixth resistor R6 being connected with a second terminal of the fifth sampling resistor Rs5; the third current sensing device includes a third current transformer CT3, a seventh resistor R7, a seventh diode D7 and a sixth sampling resistor Rs6, a first terminal on a secondary side of the third current transformer CT3 being connected with a first terminal of the seventh resistor R7, an anode of the seventh diode D7 being connected with the first terminal of the seventh resistor R7, a cathode of the seventh diode D7 being connected with a first terminal of the sixth sampling resistor Rs6, a second terminal of the seventh resistor R7 being connected with a second terminal of the sixth sampling resistor Rs6.

In an embodiment, the first terminal of the first inductor L1 of the bridgeless PFC circuit is connected with the first terminal of the AC power supply of the bridgeless PFC circuit, the second terminal of the first inductor L1 is connected with the anode of the first boost diode D1 of the bridgeless PFC circuit and connected to the first terminal of the first switch transistor S1 of the bridgeless PFC circuit; a first terminal on a primary side of the first current transformer CT1 is connected with the second terminal of the first switch transistor S1 of the bridgeless PFC circuit, a second terminal on the primary side of the first current transformer CT1 is connected with the ground of the bridgeless PFC circuit; a second terminal on the secondary side of the first current transformer CT1 is connected with the ground of the bridgeless PFC circuit; the second terminal of the fifth resistor R5 and the second terminal of the fourth sampling resistor Rs4 are connected to the ground of the bridgeless PFC circuit; the cathode of the first boost diode D1 is connected with the positive input of the PFC capacitor C1 of the bridgeless PFC circuit; the first terminal of the second inductor L2 of the bridgeless PFC circuit is connected with the second terminal of the AC power supply, the second terminal of the second inductor L2 is connected with the anode of the second boost diode D2 of the bridgeless PFC circuit and connected to the first terminal of the second switch transistor S2 of the bridgeless PFC circuit; a first terminal on a primary side of the second current transformer CT2 is connected with the second terminal of the second switch transistor S2 of the bridgeless PFC circuit, a second terminal on the primary side of the second current transformer CT2 is connected with the ground of the bridgeless PFC circuit; a second terminal on the secondary side of the second current transformer CT2 is connected with the ground of the bridgeless PFC circuit; the second terminal of the sixth resistor R6 and the second terminal of the fifth sampling resistor Rs5 are connected to the ground of the bridgeless PFC circuit; the cathode of the second boost diode D2 is connected with the positive input of the PFC capacitor C1 of the bridgeless PFC circuit; and a first terminal on a primary side of the third current transformer CT3 is connected with the negative output of the PFC capacitor C1 of the bridgeless PFC circuit, a second terminal on the primary side of the third current transformer CT3 is connected with the ground of the bridgeless PFC circuit; a second terminal on the secondary side of the third current transformer CT3 is connected with the ground of the bridgeless PFC circuit; the second terminal of the seventh resistor R7 and the second terminal of the sixth sampling resistor Rs6 are connected to the ground of the bridgeless PFC circuit; the first terminal of the load is connected with a positive input of an electrolytic capacitor C1, the second terminal of the load is connected with a negative output of the electrolytic capacitor C1.

In an embodiment, the induction current sampling device for a bridgeless PFC circuit is connected with a control system of the bridgeless PFC circuit and a voltage sampling device, the control system of the bridgeless PFC circuit, connected with the voltage sampling device, is configured to receive the first sampling signal V1, the second sampling signal V2 and the third sampling signal V3 transmitted from the device for sampling an induction current of a bridgeless PFC circuit and receive AC input voltage sampling signals UL and UN transmitted from the voltage sampling device.

In an embodiment, the voltage sampling device includes a first resistor R1, a second resistor R2, a third resistor R3 and a fourth resistor R4, a first terminal of the first resistor R1 being connected with the first terminal of the AC power supply of the bridgeless PFC circuit, a second terminal of the first resistor R1 being connected with a first terminal of the second resistor R2, a second terminal of the second resistor R2 being connected to the ground, a first terminal of the third resistor R3 being connected with the second terminal of the AC power supply of the PFC circuit, a second terminal of the third resistor R3 being connected with a first terminal of the fourth resistor R4, a second terminal of the fourth resistor R4 being connected to the ground; the second terminal of the first resistor R1 and the first terminal of the second resistor R2 being connected the control system of the bridgeless PFC circuit, the second terminal of the third resistor R3 and the first terminal of the fourth resistor R4 being connected to the control system of the bridgeless PFC circuit.

Embodiments of the disclosure further provide a method for determining an induction current sampling signal of a bridgeless PFC circuit, for use in the aforementioned device for sampling an induction current of a bridgeless PFC circuit, the method includes: the control system of the bridgeless PFC circuit selects among the first sampling signal V1, the second sampling signal V2 and the third sampling signal V3 transmitted from the device for sampling an induction current of a bridgeless PFC circuit, according to the AC input voltage sampling signals UL and UN transmitted from the voltage sampling device so as to determine the induction current sampling signal of the bridgeless PFC circuit.

In an embodiment, the method may further include: the control system of the bridgeless PFC circuit acquires the AC input voltage sampling signals UL and UN, and calculates Uac according to formula 1:

$$Uac = UL - UN \quad \text{(Formula 1)};$$

if Uac>0 and Uac≤Uacref, the control system of the bridgeless PFC circuit selects the first sampling signal V1 as the induction current sampling signal of the bridgeless PFC circuit, wherein 0<Uacref<Upeak with Uacref being a reference level and Upeak being a peak value of an AC input voltage; if Uac>0 and Uac>Uacref, the control system of the bridgeless PFC circuit selects the third sampling signal V3 as the induction current sampling signal of the bridgeless PFC circuit; if Uac≤0 and Uac≥−Uacref, the control system of the bridgeless PFC circuit selects the second sampling signal V2 as the induction current sampling signal of the bridgeless PFC circuit; or if Uac>0 and Uac<−Uacref, the control system of the bridgeless PFC circuit selects the third sampling signal V3 as the induction current sampling signal of the bridgeless PFC circuit.

In an embodiment, the method may further include: a driving signal is output to the bridgeless PFC circuit according to the induction current sampling signal of the bridgeless PFC circuit.

Beneficial effects of embodiments the disclosure are as follows.

Three sampling units are used to sample currents flowing through a switch transistor and a diode of the bridgeless PFC circuit, sampled signals are delivered to a control system of the PFC circuit so that associated calculation and control can be performed on them, which makes it possible to reduce difficulty and complexity of the control; furthermore, sampling currents flowing through a switch transistor and a diode of the bridgeless PFC circuit makes it possible to properly represent a current in a boost inductor of the bridgeless PFC circuit; the sampling is more comprehensive and the control is more flexible, thus being capable of avoiding loss of control of the control loop in the case when the AC input voltage is very high and the duty cycle is very small.

DETAILED DESCRIPTION

Exemplary embodiments of the disclosure will be further elaborated below with reference to accompanying drawings. Though the drawings shows exemplary embodiments of the disclosure, it should be appreciated that the disclosure may be implemented in various forms instead of being limited by embodiments illustrated herein. On the contrary, the provision of there embodiments is intended to make the disclosure thoroughly understood and to deliver a complete disclosure to those skilled in the art.

In order to solve the problem in the prior art that reliability of a power supply is reduced during induction current sampling due to the small duty cycle of the PFC circuit in the case when an AC input voltage is very high in the bridgeless PFC circuit, the disclosure provides an induction current sampling device and method for a bridgeless PFC circuit, which will be further elaborated with reference to the accompanying drawings and embodiments. It should be understood that the specific embodiments are only used to interpret the disclosure instead of limiting the disclosure.

Embodiments of the Device

Figure 1:
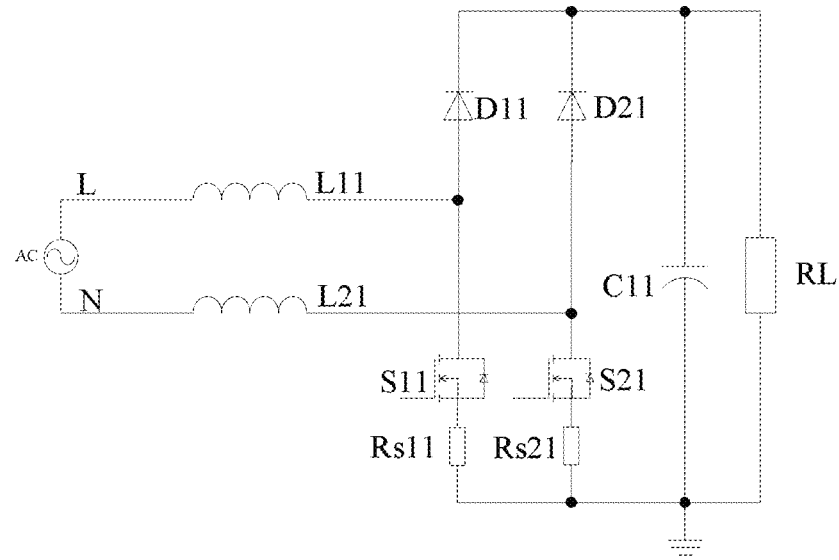
FIG. 1 is schematic diagram of bi-resistor sampling mode in the prior art.
Figure 2:
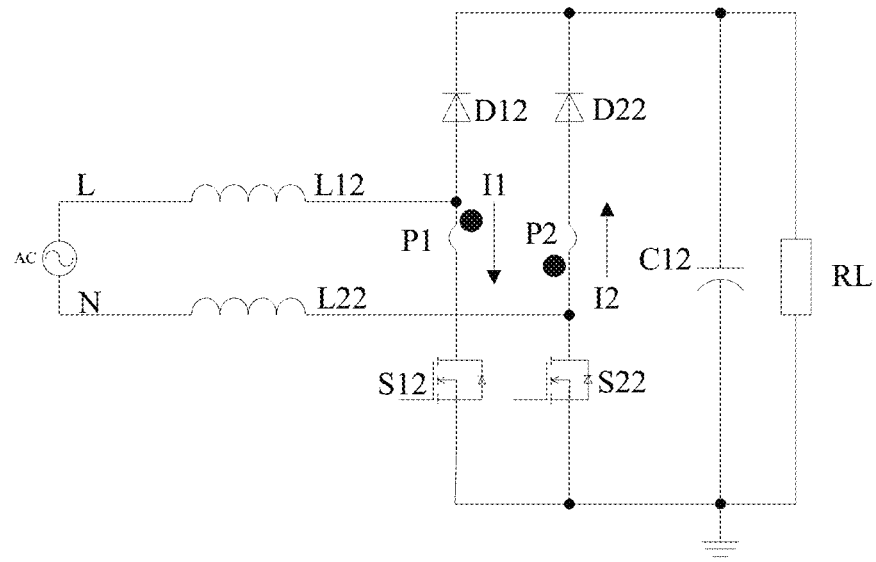
FIG. 2 is schematic diagram of bi-current-transformer sampling mode in the prior art.
Figure 3:
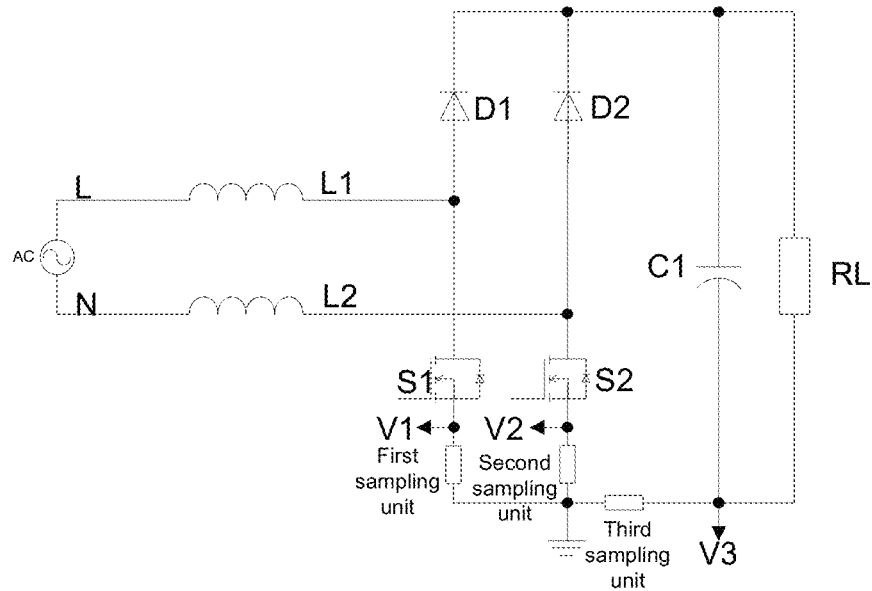
FIG. 3 is a schematic structural diagram of an induction current sampling device for a bridgeless PFC circuit according to an embodiment of the disclosure.

According to an embodiment of the disclosure, provided is an induction current sampling device for a bridgeless PFC circuit; FIG. 3 is a schematic structural diagram of the induction current sampling device for a bridgeless PFC circuit according to an embodiment of the disclosure, as shown in FIG. 3, the induction current sampling device for a bridgeless PFC circuit according to the embodiment of the disclosure includes:

a first sampling unit, a second sampling circuit and a third sampling circuit, wherein the first sampling unit, connected in serial with a first switch transistor of the bridgeless PFC circuit, is configured to sample a current flowing through the first switch transistor to acquire a first sampling signal V1; the second sampling unit, connected in serial with a second switch transistor of the bridgeless PFC circuit, is configured to sample a current flowing through the second switch transistor to acquire a second sampling signal V2; and the third sampling unit, with one terminal connected with a ground of the bridgeless PFC circuit and the other terminal connected with a negative output of a PFC capacitor of the bridgeless PFC circuit, is configured to sample a current flowing through a boost diode of the bridgeless PFC circuit to acquire a third sampling signal V3.

In the embodiment of the disclosure, the first sampling unit is a first sampling resistor or a first current sensing device, the second sampling unit is a second sampling resistor or a second current sensing device, and the third sampling unit is a third sampling resistor or a third current sensing device.

The above technical solutions according to embodiments of the disclosure will be elaborated below with reference to two examples.

In a first example, the first sampling unit is a first sampling resistor Rs1, the second sampling unit is a second sampling resistor Rs2, the third sampling unit is a third sampling resistor Rs3.

Figure 4:
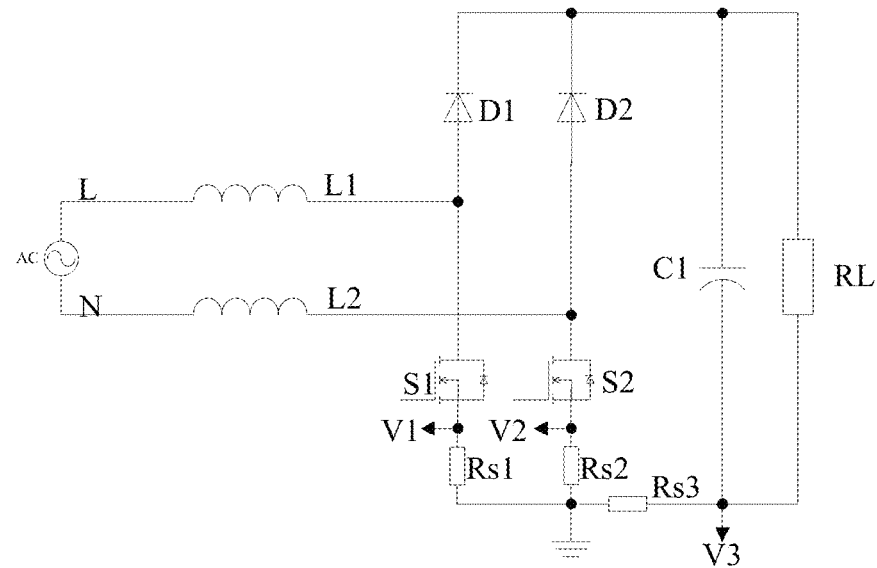
FIG. 4 is a schematic structural diagram of a first example according to an embodiment of the disclosure.

FIG. 4 is a schematic structural diagram of a first example according to an embodiment of the disclosure, as shown in FIG. 4, a first terminal of a first inductor L1 of the bridgeless PFC circuit is connected with a first terminal of an AC power supply of the bridgeless PFC circuit, a second terminal of the first inductor L1 is connected with an anode of a first boost diode D1 of the bridgeless PFC circuit and connected to a first terminal of a first switch transistor S1 of the bridgeless PFC circuit; a second terminal of the first switch transistor S1 is connected with a first terminal of the first sampling resistor Rs1, and delivers the first sampling signal V1 of the induction current of the bridgeless PFC circuit; a second terminal of the first sampling resistor Rs1 is connected with the ground of the bridgeless PFC circuit; a cathode of the first boost diode D1 is connected with a positive input of a PFC capacitor C1 of the bridgeless PFC circuit;

a first terminal of a second inductor L2 of the bridgeless PFC circuit is connected with a second terminal of the AC power supply, a second terminal of the second inductor L2 is connected with an anode of a second boost diode D2 of the bridgeless PFC circuit and connected to a first terminal of a second switch transistor S2 of the bridgeless PFC circuit; a second terminal of the second switch transistor S2 is connected with a first terminal of the second sampling resistor Rs2, and delivers the second sampling signal V2 of the induction current of the bridgeless PFC circuit; a second terminal of the second sampling resistor Rs2 is connected with the ground of the bridgeless PFC circuit; a cathode of the second boost diode D2 is connected with the positive input of the PFC capacitor C1 of the bridgeless PFC circuit; and a first terminal of the third sampling resistor Rs3 is connected with the ground of the bridgeless PFC circuit, a second terminal of the third sampling resistor Rs3 is connected with a negative output of the PFC capacitor C1 of the bridgeless PFC capacitor, and delivers the third sampling signal V3 of the induction current of the bridgeless PFC circuit; a first terminal of a load is connected with a positive input of an electrolytic capacitor C1, a second terminal of the load is connected with a negative output of the electrolytic capacitor C1.

Figure 5:
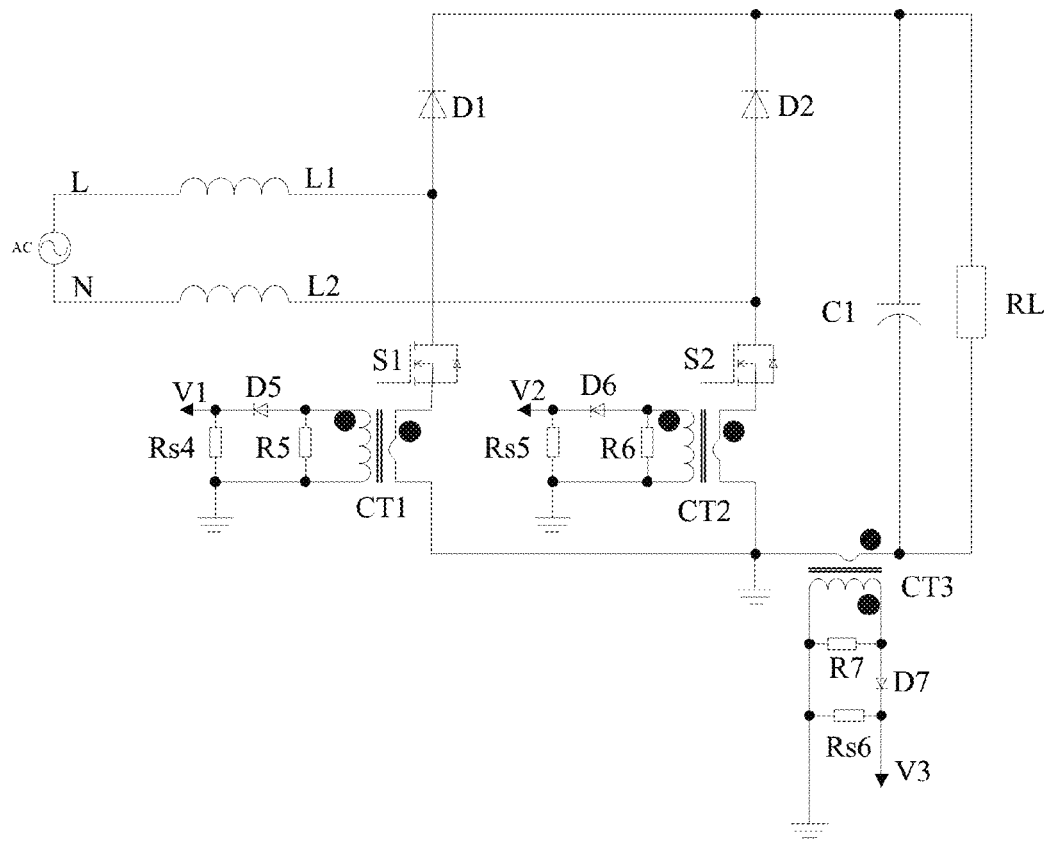
FIG. 5 is a schematic structural diagram of a second example according to an embodiment of the disclosure.

In a second example, the first sampling unit is the first current sensing device, the second sampling unit is the second current sensing device, and the third sampling unit is the third current sensing device;

FIG. 5 is a schematic diagram of a second example according to an embodiment of the disclosure, as shown in FIG. 5, the first current sensing device includes a first current transformer CT1, a fifth resistor R5, a fifth diode D5 and a fourth sampling resistor Rs4, a first terminal on a secondary side of the first current transformer CT1 being connected with a first terminal of the fifth resistor R5, an anode of the fifth diode D5 being connected with the first terminal of the fifth resistor R5, a cathode of the fifth diode D5 being connected with a first terminal of the fourth sampling resistor Rs4 and delivering the first sampling signal V1 of the induction current of the bridgeless PFC circuit, a second terminal of the fifth resistor R5 being connected with a second terminal of the fourth sampling resistor Rs4;

the second current sensing device includes a second current transformer CT2, a sixth resistor R6, a sixth diode D6 and a fifth sampling resistor Rs5, a first terminal on a secondary side of the second current transformer CT2 being connected with a first terminal of the sixth resistor R6, an anode of the sixth diode D6 being connected with the first terminal of the sixth resistor R6, a cathode of the sixth diode D6 being connected with a first terminal of the fifth sampling resistor Rs5 and delivering the second sampling signal V2 of the induction current of the bridgeless PFC circuit, a second terminal of the sixth resistor R6 being connected with a second terminal of the fifth sampling resistor Rs5;

the third current sensing device includes a third current transformer CT3, a seventh resistor R7, a seventh diode D7 and a sixth sampling resistor Rs6, a first terminal on a secondary side of the third current transformer CT3 being connected with a first terminal of the seventh resistor R7, an anode of the seventh diode D7 being connected with the first terminal of the seventh resistor R7, a cathode of the seventh diode D7 being connected with a first terminal of the sixth sampling resistor Rs6 and delivering the third sampling signal V3 of the induction current of the bridgeless PFC circuit, a second terminal of the seventh resistor R7 being connected with a second terminal of the sixth sampling resistor Rs6.

The first terminal of the first inductor L1 of the bridgeless PFC circuit is connected with the first terminal of the AC power supply of the bridgeless PFC circuit, the second terminal of the first inductor L1 is connected with the anode of the first boost diode D1 of the bridgeless PFC circuit and connected to the first terminal of the first switch transistor S1 of the bridgeless PFC circuit; a first terminal on a primary side of the first current transformer CT1 is connected with the second terminal of the first switch transistor S1 of the bridgeless PFC circuit, a second terminal on the primary side of the first current transformer CT1 is connected with the ground of the bridgeless PFC circuit; a second terminal on the secondary side of the first current transformer CT1 is connected with the ground of the bridgeless PFC circuit; the second terminal of the fifth resistor R5 and the second terminal of the fourth sampling resistor Rs4 are connected to the ground of the bridgeless PFC circuit; the cathode of the first boost diode D1 is connected with the positive input of the PFC capacitor C1 of the bridgeless PFC circuit;

the first terminal of the second inductor L2 of the bridgeless PFC circuit is connected with the second terminal of the AC power supply, the second terminal of the second inductor L2 is connected with the anode of the second boost diode D2 of the bridgeless PFC circuit and connected to the first terminal of the second switch transistor S2 of the bridgeless PFC circuit; a first terminal on a primary side of the second current transformer CT2 is connected with the second terminal of the second switch transistor S2 of the bridgeless PFC circuit, a second terminal on the primary side of the second current transformer CT2 is connected with the ground of the bridgeless PFC circuit; a second terminal on the secondary side of the second current transformer CT2 is connected with the ground of the bridgeless PFC circuit; the second terminal of the sixth resistor R6 and the second terminal of the fifth sampling resistor Rs5 are connected to the ground of the bridgeless PFC circuit; the cathode of the second boost diode D2 is connected with the positive input of the PFC capacitor C1 of the bridgeless PFC circuit; and a first terminal on a primary side of the third current transformer CT3 is connected with the negative output of the PFC capacitor C1 of the bridgeless PFC circuit, a second terminal on the primary side of the third current transformer CT3 is connected with the ground of the bridgeless PFC circuit; a second terminal on the secondary side of the third current transformer CT3 is connected with the ground of the bridgeless PFC circuit; the second terminal of the seventh resistor R7 and the second terminal of the sixth sampling resistor Rs6 are connected to the ground of the bridgeless PFC circuit; the first terminal of the load is connected with a positive input of an electrolytic capacitor C1, the second terminal of the load is connected with a negative output of the electrolytic capacitor C1.

Figure 6:
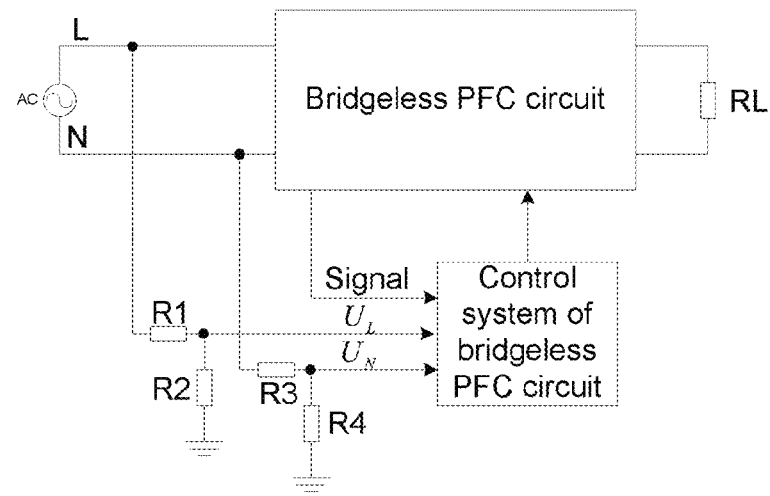
FIG. 6 is a schematic diagram showing connection relation of a control system of the PFC circuit according to an embodiment of the disclosure.

FIG. 6 is a schematic diagram showing connection relation of a control system of the PFC circuit according to an embodiment of the disclosure, as shown in FIG. 6, the induction current sampling device for a bridgeless PFC circuit is connected with a control system of the bridgeless PFC circuit and a voltage sampling device, the control system of the bridgeless PFC circuit, connected with the voltage sampling device, is configured to receive the first sampling signal V1, the second sampling signal V2 and the third sampling signal V3 transmitted from the induction current sampling device for a bridgeless PFC circuit and receive an AC input voltage sampling signal Uac transmitted from the voltage sampling device.

That is to say, the control system of the bridgeless PFC circuit samples an AC input L line using resistors R1 and R2 so as to obtain a voltage sampling signal UL of the AC input L line; the control system of the bridgeless PFC circuit samples an AC input N line using resistors R3 and R4 so as to obtain a voltage sampling signal UN of the AC input N line; the control system of the bridgeless PFC circuit reads the voltage sampling signal UL of the AC input L line and the voltage sampling signal UN of the AC input N line, calculates an AC input voltage signal Uac (Uac=UL−UN), and determines the induction current sampling signal of the bridgeless PFC circuit through determination of the AC input voltage signal Uac; through associated calculations, the control system of the bridgeless PFC circuit outputs a driving signal to the bridgeless PFC circuit, this ensures a stable operation of the bridgeless PFC circuit so that the AC input current follows the AC input voltage, thereby achieving the purpose of power factor correction.

Specifically, the voltage sampling device includes a first resistor R1, a second resistor R2, a third resistor R3 and a fourth resistor R4, a first terminal of the first resistor R1 being connected with the first terminal of the AC power supply of the bridgeless PFC circuit, a second terminal of the first resistor R1 being connected with a first terminal of the second resistor R2, a second terminal of the second resistor R2 being connected to the ground, a first terminal of the third resistor R3 being connected with the second terminal of the AC power supply of the PFC circuit, a second terminal of the third resistor R3 being connected with a first terminal of the fourth resistor R4, a second terminal of the fourth resistor R4 being connected to the ground; the second terminal of the first resistor R1 and the first terminal of the second resistor R2 being connected the control system of the bridgeless PFC circuit, the second terminal of the third resistor R3 and the first terminal of the fourth resistor R4 being connected to the control system of the bridgeless PFC circuit.

To sum up, in the induction current sampling device for a bridgeless PFC circuit according to the embodiment of the disclosure, three sampling units take charge of sampling currents flowing through a switch transistor and a diode of the bridgeless PFC circuit so that currents in inductors of the bridgeless PFC circuit can be properly represented; the sampling is more comprehensive and the control is more flexible, thus being capable of avoiding loss of control of the control loop in the case when the AC input voltage is very high and the duty cycle is very small.

Embodiments of the Method

Figure 7:
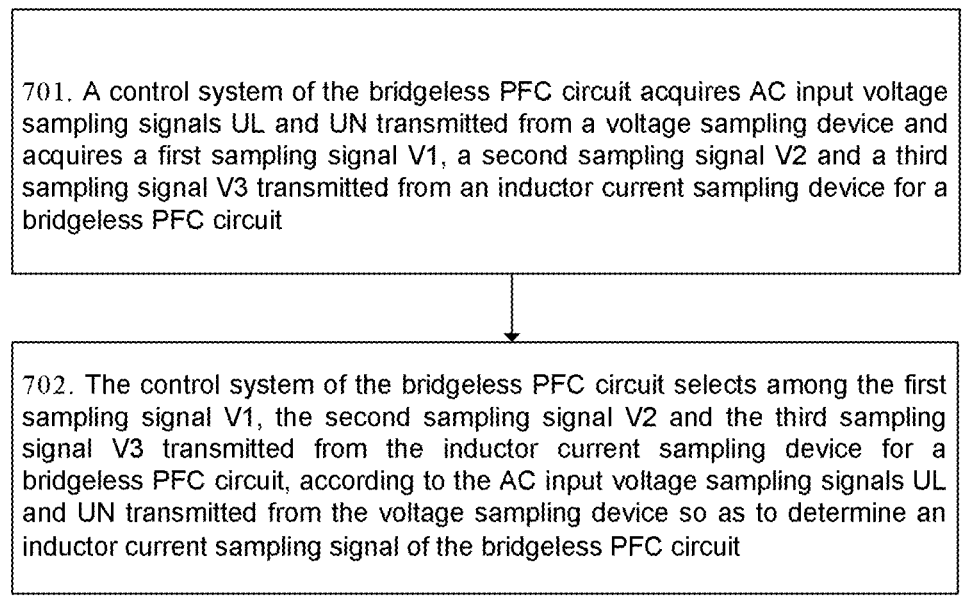
FIG. 7 is a flowchart of a method for determining an induction current sampling signal of a bridgeless PFC circuit according to an embodiment of the disclosure.

According to an embodiment of the disclosure, provided is a method for determining an induction current sampling signal of a bridgeless PFC circuit, for use in the aforementioned induction current sampling device for a bridgeless PFC circuit; FIG. 7 is a flowchart of a method for determining an induction current sampling signal of a bridgeless PFC circuit according to an embodiment of the disclosure, as shown in FIG. 7, the method for determining an induction current sampling signal of a bridgeless PFC circuit according to the embodiment of the disclosure includes steps as follows.

Step 701, a control system of the bridgeless PFC circuit acquires AC input voltage sampling signals UL and UN transmitted from a voltage sampling device and acquires a first sampling signal V1, a second sampling signal V2 and a third sampling signal V3 transmitted from an induction current sampling device for a bridgeless PFC circuit;

step 702, the control system of the bridgeless PFC circuit selects among the first sampling signal V1, the second sampling signal V2 and the third sampling signal V3 transmitted from the induction current sampling device for a bridgeless PFC circuit, according to the AC input voltage sampling signals UL and UN transmitted from the voltage sampling device so as to determine an induction current sampling signal of the bridgeless PFC circuit.

Figure 8:
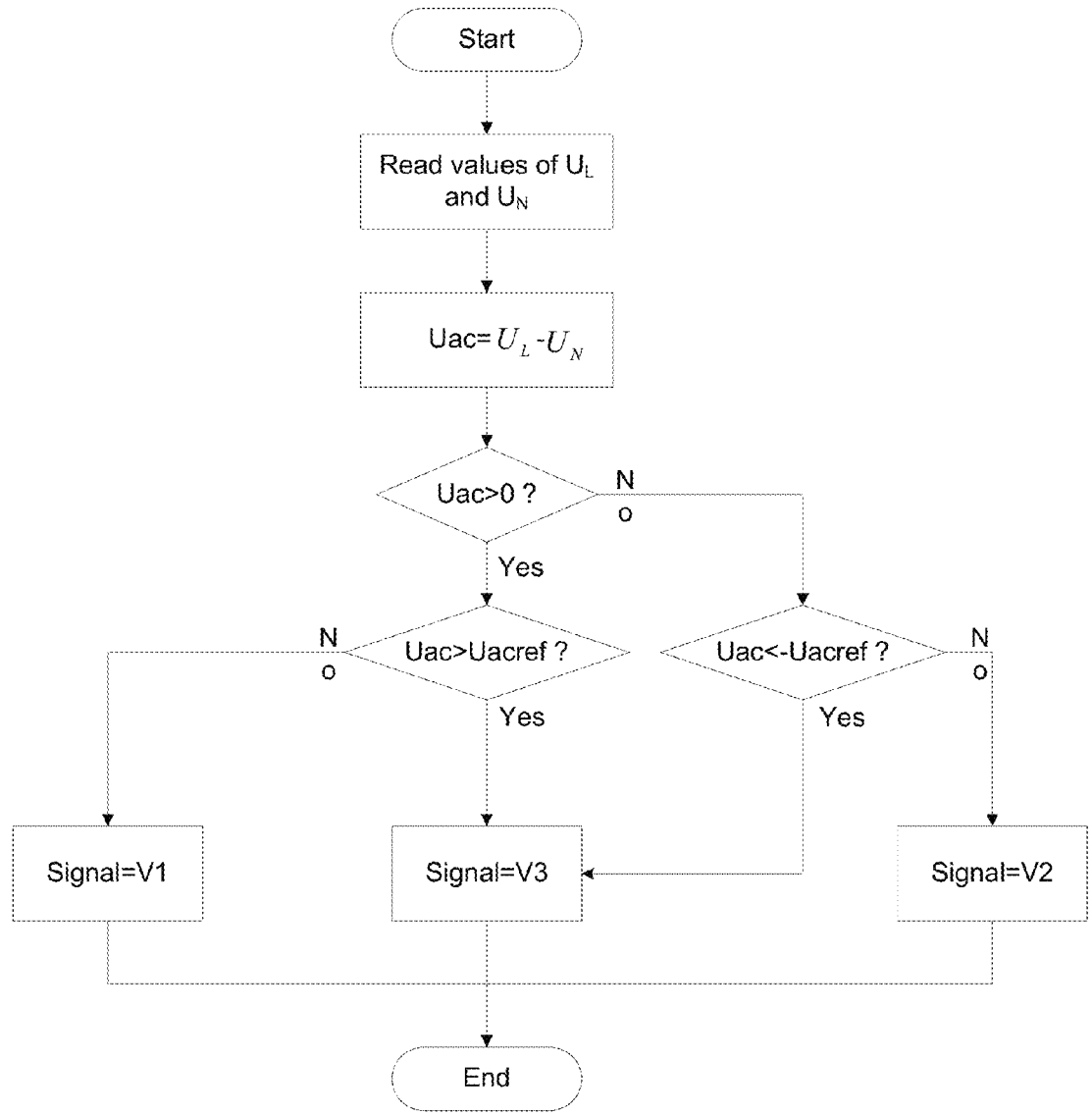
FIG. 8 is a flowchart for determining an induction current sampling signal of a bridgeless PFC circuit according to an embodiment of the disclosure.

The step 702 specifically includes the following processing:

FIG. 8 is a flowchart for determining an induction current sampling signal of a bridgeless PFC circuit according to an embodiment of the disclosure, as shown in FIG. 8:

the control system of the bridgeless PFC circuit acquires the AC input voltage sampling signals UL and UN, and calculates Uac according to formula 1:

$$Uac=UL-UN \qquad \text{(Formula 1)};$$

if Uac>0 and Uac≤Uacref, the control system of the bridgeless PFC circuit selects the first sampling signal V1 as the induction current sampling signal of the bridgeless PFC circuit, wherein 0<Uacref<Upeak with Uacref being a reference level and Upeak being a peak value of an AC input voltage;

if Uac>0 and Uac>Uacref, the control system of the bridgeless PFC circuit selects the third sampling signal V3 as the induction current sampling signal of the bridgeless PFC circuit;

if Uac≤0 and Uac≥−Uacref, the control system of the bridgeless PFC circuit selects the second sampling signal V2 as the induction current sampling signal of the bridgeless PFC circuit; or if Uac>0 and Uac>Uacref, the control system of the bridgeless PFC circuit selects the third sampling signal V3 as the induction current sampling signal of the bridgeless PFC circuit.

Preferably, after the above processing, the control system of the bridgeless PFC circuit outputs a driving signal to the bridgeless PFC circuit according to the induction current sampling signal of the bridgeless PFC circuit.

To sum up, as shown in FIG. 6, the control system of the bridgeless PFC circuit samples an AC input L line using resistors R1 and R2 so as to obtain a voltage sampling signal UL of the AC input L line; the control system of the bridgeless PFC circuit samples an AC input N line using resistors R3 and R4 so as to obtain a voltage sampling signal UN of the AC input N line; the control system of the bridgeless PFC circuit reads the voltage sampling signal UL of the AC input L line and the voltage sampling signal UN of the AC input N line, calculates an AC input voltage signal Uac (Uac=UL−UN), and determines the induction current sampling signal of the bridgeless PFC circuit through determination of the AC input voltage signal Uac; through associated calculations, the control system of the bridgeless PFC circuit outputs a driving signal to the bridgeless PFC circuit, this ensures a stable operation of the bridgeless PFC circuit so that the AC input current follows the AC input voltage, thereby achieving the purpose of power factor correction.

To sum up, with technical solutions according to embodiments of the disclosure, three sampling units are used to sample currents flowing through a switch transistor and a diode of the bridgeless PFC circuit, sampled signals are delivered to a control system of the PFC circuit so that associated calculation and control can be performed on them, which makes it possible to reduce difficulty and complexity of the control; furthermore, sampling currents flowing through a switch transistor and a diode of the bridgeless PFC circuit makes it possible to properly represent a current in a boost inductor of the bridgeless PFC circuit; the sampling is more comprehensive and the control is more flexible, thus being capable of avoiding loss of control of the control loop in the case when the AC input voltage is very high and the duty cycle is very small.

The disclosure are described through specific embodiments, but it should be appreciated by those skilled in the art that various variants and substitutions can be made to the disclosure without departing from the scope of the disclosure. Therefore, the disclosure is not limited to specific embodiments disclosed herein instead it should include all embodiments falling within the scope of protection defined by the claims.

INDUSTRIAL APPLICABILITY

In embodiments of the disclosure, three sampling units are used to sample currents flowing through a switch transistor and a diode of the bridgeless PFC circuit, sampled signals are delivered to a control system of the PFC circuit so that related calculation and control can be performed, which makes it possible to reduce difficulty and complexity of the control; furthermore, sampling currents flowing through a switch transistor and a diode of the bridgeless PFC circuit makes it possible to properly represent a current in a boost inductor of the bridgeless PFC circuit; the sampling is more comprehensive and the control is more flexible, thus being capable of avoiding loss of control of the control loop in the case when the AC input voltage is very high and the duty cycle is very small.

The invention claimed is:

1. An induction current sampling device for a bridgeless Power Factor Correction (PFC) circuit, connected to the bridgeless PFC circuit, comprising a first sampling unit, a second sampling circuit and a third sampling circuit, wherein the first sampling unit, connected in serial with a first switch transistor of the bridgeless PFC circuit, is configured to sample a current flowing through the first switch transistor to acquire a first sampling signal V1; the second sampling unit, connected in serial with a second switch transistor of the bridgeless PFC circuit, is configured to sample a current flowing through the second switch transistor to acquire a second sampling signal V2; and the third sampling unit, with one terminal connected with a ground of the bridgeless PFC circuit and the other terminal connected with a negative output of a PFC capacitor of the bridgeless PFC circuit, is configured to sample a current flowing through a boost diode of the bridgeless PFC circuit to acquire a third sampling signal V3, wherein the first sampling unit is a first sampling resistor or a first current sensing device, the second sampling unit is a second sampling resistor or a second current sensing device, and the third sampling unit is a third sampling resistor or a third current sensing device, when the first sampling unit is the first current sensing device, the second sampling unit is the second current sensing device, and the third sampling unit is the third current sensing device, the first current sensing device comprises a first current transformer CT1, a fifth resistor R5, a fifth diode D5 and a fourth sampling resistor Rs4, a first terminal on a secondary side of the first current transformer CT1 being connected with a first terminal of the fifth resistor R5, an anode of the fifth diode D5 being connected with the first terminal of the fifth resistor R5, a cathode of the fifth diode D5 being connected with a first terminal of the fourth sampling resistor Rs4, a second terminal of the fifth resistor R5 being connected with a second terminal of the fourth sampling resistor Rs4;

the second current sensing device comprises a second current transformer CT2, a sixth resistor R6, a sixth diode D6 and a fifth sampling resistor Rs5, a first terminal on a secondary side of the second current transformer CT2 being connected with a first terminal of the sixth resistor R6, an anode of the sixth diode D6 being connected with the first terminal of the sixth resistor R6, a cathode of the sixth diode D6 being connected with a first terminal of the fifth sampling resistor Rs5, a second terminal of the sixth resistor R6 being connected with a second terminal of the fifth sampling resistor Rs5;

the third current sensing device comprises a third current transformer CT3, a seventh resistor R7, a seventh diode D7 and a sixth sampling resistor Rs6, a first terminal on a secondary side of the third current transformer CT3 being connected with a first terminal of the seventh resistor R7, an anode of the seventh diode D7 being connected with the first terminal of the seventh resistor R7, a cathode of the seventh diode D7 being connected with a first terminal of the sixth sampling resistor Rs6, a second terminal of the seventh resistor R7 being connected with a second terminal of the sixth sampling resistor Rs6.

2. The device according to claim 1, wherein when the first sampling unit is a first sampling resistor Rs1, the second sampling unit is a second sampling resistor Rs2, the third sampling unit is a third sampling resistor Rs3;

a first terminal of a first inductor L1 of the bridgeless PFC circuit is connected with a first terminal of an AC power supply of the bridgeless PFC circuit, a second terminal of the first inductor L1 is connected with an anode of a first boost diode D1 of the bridgeless PFC circuit and connected to a first terminal of the first switch transistor S1 of the bridgeless PFC circuit; a second terminal of the first switch transistor S1 is connected with a first terminal of the first sampling resistor Rs1; a second terminal of the first sampling resistor Rs1 is connected with the ground of the bridgeless PFC circuit; a cathode of the first boost diode D1 is connected with a positive input of the PFC capacitor C1 of the bridgeless PFC circuit;

a first terminal of a second inductor L2 of the bridgeless PFC circuit is connected with a second terminal of the AC power supply, a second terminal of the second inductor L2 is connected with an anode of a second boost diode D2 of the bridgeless PFC circuit and connected to a first terminal of the second switch transistor S2 of the bridgeless PFC circuit; a second terminal of the second switch transistor S2 is connected with a first terminal of the second sampling resistor Rs2; a second terminal of the second sampling resistor Rs2 is connected with the ground of the bridgeless PFC circuit; a cathode of the second boost diode D2 is connected with the positive input of the PFC capacitor C1 of the bridgeless PFC circuit; and a first terminal of the third sampling resistor Rs3 is connected with the ground of the bridgeless PFC circuit, a second terminal of the third sampling resistor Rs3 is connected with a negative output of the PFC capacitor C1 of the bridgeless PFC circuit; a first terminal of a load is connected with a positive input of the PFC capacitor C1, a second terminal of the load is connected with a negative output of the PFC capacitor C1.

3. The device according to claim 1, wherein
the first terminal of the first inductor L1 of the bridgeless PFC circuit is connected with the first terminal of the AC power supply of the bridgeless PFC circuit, the second terminal of the first inductor L1 is connected with the anode of the first boost diode D1 of the bridgeless PFC circuit and connected to the first terminal of the first switch transistor S1 of the bridgeless PFC circuit; a first terminal on a primary side of the first current transformer CT1 is connected with the second terminal of the first switch transistor S1 of the bridgeless PFC circuit, a second terminal on the primary side of the first current transformer CT1 is connected with the ground of the bridgeless PFC circuit; a second terminal on the secondary side of the first current transformer CT1 is connected with the ground of the bridgeless PFC circuit; the second terminal of the fifth resistor R5 and the second terminal of the fourth sampling resistor Rs4 are connected to the ground of the bridgeless PFC circuit; the cathode of the first boost diode D1 is connected with the positive input of the PFC capacitor C1 of the bridgeless PFC circuit;

the first terminal of the second inductor L2 of the bridgeless PFC circuit is connected with the second terminal of the AC power supply, the second terminal of the second inductor L2 is connected with the anode of the second boost diode D2 of the bridgeless PFC circuit and connected to the first terminal of the second switch transistor S2 of the bridgeless PFC circuit; a first terminal on a primary side of the second current transformer CT2 is connected with the second terminal of the second switch transistor S2 of the bridgeless PFC circuit, a second terminal on the primary side of the second current transformer CT2 is connected with the ground of the bridgeless PFC circuit; a second terminal on the secondary side of the second current transformer CT2 is connected with the ground of the bridgeless PFC circuit; the second terminal of the sixth resistor R6 and the second terminal of the fifth sampling resistor Rs5 are connected to the ground of the bridgeless PFC circuit; the cathode of the second boost diode D2 is connected with the positive input of the PFC capacitor C1 of the bridgeless PFC circuit; and a first terminal on a primary side of the third current transformer CT3 is connected with the negative output of the PFC capacitor C1 of the bridgeless PFC circuit, a second terminal on the primary side of the third current transformer CT3 is connected with the ground of the bridgeless PFC circuit; a second terminal on the secondary side of the third current transformer CT3 is connected with the ground of the bridgeless PFC circuit; the second terminal of the seventh resistor R7 and the second terminal of the sixth sampling resistor Rs6 are connected to the ground of the bridgeless PFC circuit; the first terminal of the load is connected with a positive input of the PFC capacitor C1, the second terminal of the load is connected with a negative output of the PFC capacitor C1.

4. The device according to claim 1, wherein the induction current sampling device for a bridgeless PFC circuit is connected with a control system of the bridgeless PFC circuit and a voltage sampling device, the control system of the bridgeless PFC circuit, connected with the voltage sampling device, is configured to receive the first sampling signal V1, the second sampling signal V2 and the third sampling signal V3 transmitted from the induction current sampling device for a bridgeless PFC circuit and receive AC input voltage sampling signals UL and UN transmitted from the voltage sampling device.

5. The device according to claim 4, wherein the voltage sampling device comprises a first resistor R1, a second resistor R2, a third resistor R3 and a fourth resistor R4, a first terminal of the first resistor R1 being connected with the first terminal of the AC power supply of the bridgeless PFC circuit, a second terminal of the first resistor R1 being connected with a first terminal of the second resistor R2, a second terminal of the second resistor R2 being connected to the ground, a first terminal of the third resistor R3 being connected with the second terminal of the AC power supply of the PFC circuit, a second terminal of the third resistor R3 being connected with a first terminal of the fourth resistor R4, a second terminal of the fourth resistor R4 being connected to the ground; the second terminal of the first resistor R1 and the first terminal of the second resistor R2 being connected the control system of the bridgeless PFC circuit, the second terminal of the third resistor R3 and the first terminal of the fourth resistor R4 being connected to the control system of the bridgeless PFC circuit.

6. A method for determining an induction current sampling signal of a bridgeless PFC circuit, for use in the induction current sampling device for a bridgeless PFC circuit according to claim 1, the method comprising:
selecting, by the control system of the bridgeless PFC circuit, among the first sampling signal V1, the second sampling signal V2 and the third sampling signal V3 transmitted from the induction current sampling device for a bridgeless PFC circuit, according to the AC input voltage sampling signals UL and UN transmitted from the voltage sampling device so as to determine the induction current sampling signal of the bridgeless PFC circuit.

7. The method according to claim 6, further comprising:
acquiring, by the control system of the bridgeless PFC circuit, the AC input voltage sampling signals UL and UN, and calculating Uac according to formula 1:

$$Uac = UL - UN \qquad \text{Formula 1;}$$

if Uac>0 and Uac≤Uacref, selecting, by the control system of the bridgeless PFC circuit, the first sampling signal V1 as the induction current sampling signal of the bridgeless PFC circuit, wherein 0<Uacref<Upeak with Uacref being a reference level and Upeak being a peak value of an AC input voltage;
if Uac>0 and Uac>Uacref, selecting, by the control system of the bridgeless PFC circuit, the third sampling signal V3 as the induction current sampling signal of the bridgeless PFC circuit;
if Uac≤0 and Uac≥−Uacref, selecting, by the control system of the bridgeless PFC circuit, the second sampling signal V2 as the induction current sampling signal of the bridgeless PFC circuit; or
if Uac>0 and Uac<−Uacref, selecting, by the control system of the bridgeless PFC circuit, the third sampling signal V3 as the induction current sampling signal of the bridgeless PFC circuit.

8. The method according to claim 7, further comprising:
outputting a driving signal to the bridgeless PFC circuit according to the induction current sampling signal of the bridgeless PFC circuit.

* * * * *